United States Patent [19]

DeVito et al.

[11] 4,102,491

[45] Jul. 25, 1978

[54] VARIABLE FUNCTION DIGITAL WORD GENERATING, RECEIVING AND MONITORING DEVICE

[75] Inventors: Louis DeVito, West Milford; Albert H. Esser, Clifton, both of N.J.

[73] Assignee: Instrumentation Engineering, Inc., Franklin Lakes, N.J.

[21] Appl. No.: 643,746

[22] Filed: Dec. 23, 1975

[51] Int. Cl.² .................. G01R 31/00; G06F 11/00
[52] U.S. Cl. .................................. 235/302; 324/73 R
[58] Field of Search ................. 235/153 AC, 302; 324/73 R

[56] References Cited

U.S. PATENT DOCUMENTS

| | | | |
|---|---|---|---|
| 3,764,995 | 10/1973 | Helf, Jr. et al. | 235/153 AC |
| 3,832,535 | 8/1974 | DeVito | 235/153 AC |
| 3,916,306 | 10/1975 | Patti | 324/73 R |
| 3,920,973 | 11/1975 | Avellar et al. | 235/153 AC |
| 3,922,537 | 11/1975 | Jackson | 235/153 AC |
| 3,931,506 | 1/1976 | Borrelli et al. | 235/153 AC |

*Primary Examiner*—Charles E. Atkinson
*Attorney, Agent, or Firm*—Morgan, Finnegan, Pine, Foley & Lee

[57] ABSTRACT

Apparatus for generating and receiving for analysis multibit digital words, which may vary from one another in voltage level, and which are applied to and received from the pins of an electronic unit under test at different variable clocked rates in response to computer commands. The apparatus includes shift registers each of which is for applying multibit digital words to a pin of a unit under test and which is paired with a receive/compare register for receiving and comparing digital responses from the pin of the unit under test, and Field Effect Transistor (FET) switches, for the real time switching of shift and receive/compare registers alternately into electrical connection with pins of the unit under test. Multiple independent programmable pulse clocks regulate the application of bits to unit under test pins in accordance with computer commands or other designated controls. Separate programmable digital to analog converter apparatus for each shift-receive/compare register channel associated with a unit under test terminal allow the applied and received multibit digital words to be varied from one another in voltage level.

6 Claims, 4 Drawing Figures

VARIABLE FUNCTION DIGITAL WORD GENERATING, RECEIVING AND MONITORING DEVICE

BACKGROUND OF THE INVENTION

The present invention relates to the field of automatic test equipment for the testing of electrical units, and more particularly and to an improved automated digital word generating and receiving test device (DWG/R) having several important advantages over those previously in use.

In U.S. Pat. No. 3,832,535, assigned to the assignee of the present invention, the application described apparatus for generating multi-bit digital words, for applying them to an electrical unit under test, and for receiving, for analysis, electrical responses from the unit under test. Prior to the advent of equipment like that disclosed in the patent, digital computers were used in the automated testing of electrical units to generate the digital word patterns to be applied to the unit under test and also for the receiving, for analysis, of the responses of the unit under test. This was not an entirely satisfactory testing method, since a digital computer is not capable of generating test signals in a faster sequence than its cycle time, and since, consequently, it is not capable of effectively testing electrical circuits which have operating frequencies significantly higher (faster) than the computer's access times.

The DWG/R described in U.S. Pat. No. 3,832,535 overcame problems mentioned above by providing a testing device: capable of: (1) generating and applying multi-bit digital words as test signals to the terminals of a unit under test in sequences rapid enought to adequately test extremely high frequency electrical units; (2) capable of receiving for analysis the electrical responses of units under test, and (3) capable of performing these functions independently of a digital computer speed.

Nevertheless, it was recognized that certain testing requirements were left unfulfilled because the lack of a truly practical solution, considering the difficulty of implementing all necessary testing functions and permutations thereof in a comprehensive system.

For instance, many electrical circuits comprise both high and low frequency electrical components which electrically interact in the routine operation of the circuits. In order to meaningfully test these components using a digital word generating device in a realistic environment, stimulus digital word signals should be applied to both high and low frequency components simultaneously, but the rates at which the digital words are applied to the high and low frequency electrical components (i.e. bits per unit time) should reflect the difference in frequency response time characteristic of the electrical components. The ability to test in this way has become even more inportant with the development of microprocessor technology since it would allow realistic automated digital word testing of microprocessor boards which comprise many electrical components which greatly vary in electrical characteristics including frequency response time.

In addition, some circuits (e.g., some microprocessor circuits) have components which in their operation electrically clock other circuit components. Moreover, such circuits often include a number of components which are internally clocked at different rates. To duplicate this situation in the automated digital word testing environment, and thus test realistically, multi-bit digital words must be applied simultaneously to such circuit components in the different clocked sequences used in the actual operation of the circuit.

Also, prior to this invention, there was a need for automatic testing apparatus capable not only of performing the digital word generating, applying and receiving functions, but also of monitoring a unit under test pin to which a digital test signal has been applied. Such a monitoring capability is highly desirable since, as those skilled in the art are aware, certain electrical units which may be tested, e.g., a bi-directional bus of a microprocessor, may generate response signals at a terminal within an extremely short period of time after a test signal has been applied; unless the testing device is able to monitor the terminals of the unit under test, this "quick" response signal may go undetected and may not be received for analysis.

In addition, it is believed that there was, prior to this invention, a need for an automated digital word testing apparatus which is capable of applying simultaneously multi-bit digital signals to the pins of a unit under test, which may differ in voltage level according to the dictates of a test program or an operator. As the components of an electrical circuit to be tested may differ in voltage response characteristics, this capability is also very desirable in an automated testing facility.

Further, it is believed that there was a need, prior to this invention, for a moderately priced multiple programmable pulse clock system for use in an automated digital testing apparatus capable of accurately regulating with high resolution the application of digital test signals to the terminals of a unit under test in accordance with computer signals, the previous responses of the unit under test or other stimuli.

It is therefore a general object of the present invention to overcome the cited difficulties and fulfill the needs mentioned by providing a device having all of the desirable testing abilities noted above.

A particular object of the invention is to provide a highly flexible and adaptable digital word generating and receiving device capable of applying simultaneously in variable clocked sequences multi-bit digital word testing signals, each of which may vary in voltage level, to the pins of a unit under test, and thereby capable of performing automatically a wide variety of tests.

A further object of the present invention is to provide a digital word generating and receiving device capable of monitoring the pins of a unit under test so that virtually all significant electrical signals emitted at the pins of a unit under test in response to test signals will be detected and received for analysis, including those response signals emitted by very quick response (high frequency) electrical units.

Another object of the present invention is to provide a multiple programmable pulse clock system for use in an automated digital word testing apparatus capable of accurately regulating with high resolution the application of digital signals of a unit under test in accordance with computer commands, previous responses of the unit under test or other stimuli. It is a further object of the invention to provide such a pulse clock system at a moderate cost.

SUMMARY OF THE INVENTION

The present invention concerns apparatus for: (1) applying multi-bit digital words, each of which may vary in voltage level from the other, to the pins of an electrical unit under test, the application of multi-bit digital words to each pin being in any selected one of a set of independent sequences defined by pulse clocks controlled by computer generated stimuli, response signals emitted by the unit under test or other stimuli; (2) for receiving for analysis electrical responses of the unit under test to the multi-bit digital word test signals applied to its pins; and (3) for monitoring the electrical activity of the unit under test after multi-bit digital words have been applied to one or more of its pins.

The apparatus includes shift registers for applying multi-bit digital words to pins of a unit under test. One shift register and an associated receive/compare register for receiving and comparing responses from the unit under test may alternately be switched into connection with a unique pin of the unit under test by means of a programmable Field Effect Transistor (FET) switch. The use of the programmable FET switches in this manner allows monitoring of each unit under test pin by means of real time switching between a drive mode in which data is applied to a pin of the unit under test from its associated shift register and a receive mode in which data is received from that pin by its associated receive/compare register.

In addition, in a preferred embodiment of the invention there is associated with each set of two shift and receive/compare registers programmable digital to analog signal converter apparatus. These allow the multi-bit digital words applied to and received from the pins of the unit under test to be varied in voltage level simultaneously during a test.

A unique feature of the preferred embodiment of the invention is a novel multiple programmable pulse clock system comprising pulse clocks in a novel arrangement which is used to regulate the application of bits to the pins of the unit under test. Each clock channel or clock can be used as a clock generator which operates independently and can be started from one of several controls (e.g. computer signal, unit under test response signal, pulse signal from another clock), or may be operated to effect a programmed delay of some other clock. Each clock includes in a novel arrangement priority encoders, oscillator sequences and several registers and counters. The priority encoder continuously generates potential output signals in eight phases, each signal at any point in time having a phase with a starting edge 5 nanoseconds apart from the starting edges of the signals immediately preceding it and succeeding it in phase. When it receives an external stimulus signal it compares it to the current potential output signals and is able to select for output the current potential output signal closest in phase to the external stimulus signal. In this way, it is possible to generate clock signals synchronized within 5 nanoseconds to an external signal using a relatively inexpensive, conventional clock. In addition, using computer loaded counters and registers and oscillator sequences in conjunction with a priority encoder, the clock is able to produce a clock wave pulse signal with programmable delays, width and periods with resolutions considerably smaller than the clock cycle time.

A BRIEF DESCRIPTION OF THE DRAWINGS

DETAILED DESCRIPTION OF A PREFERRED EMBODIMENT

The present invention is an improvement of applicant's previous invention described and claimed in his U.S. Pat. No. 3,832,535.

Figure 1:
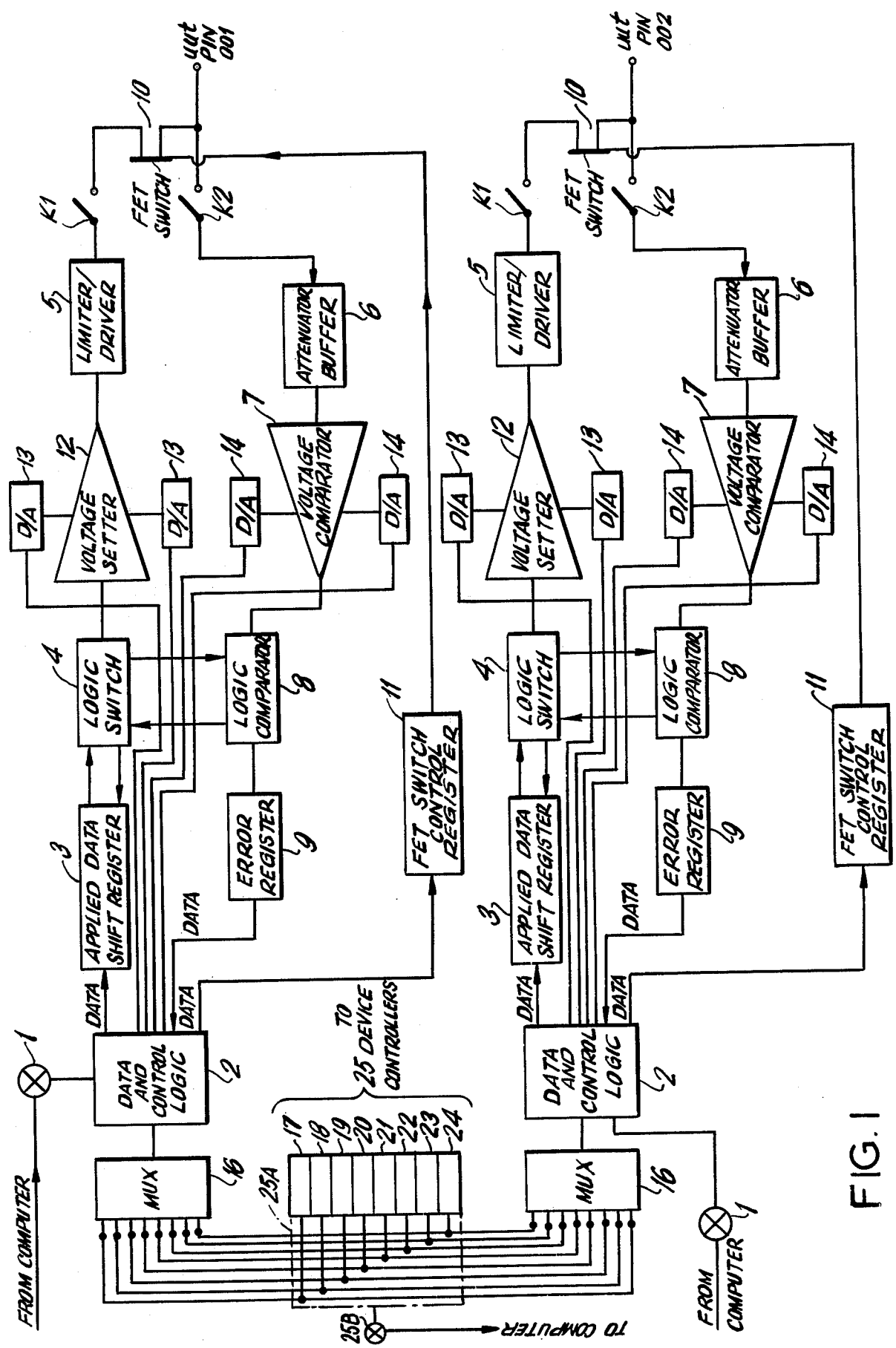
FIG. 1 is a schematic block diagram of a multi-clock, multi-voltage level, multi-bit digital word generating, receiving and monitoring device in accordance with the invention.

The use and operation of applicant's new improved apparatus can best be appreciated from FIG. 1.

FIG. 1 represents in block diagram form the fundamental elements of a multi-clock, multi-voltage level, digital word generating, receiving and monitoring device, for generating sequential bit patterns for application to two test points, or two pins of a UUT, and also for monitoring the test points and receiving and analyzing second digital bit patterns received at the test points. In the descriptions that follow, the apparatus and operation associated with only two channels associated with two test points are explained, but the same principles of operations apply to the remaining test points of the system as well. If, for example, it is desired to be able to apply a sequence of bits to 100 separate pins of a UUT, or to receive data from those pins, there will exist 100 generator and receiver channnels.

In FIG. 1, as in applicant's invention described in U.S. Pat. No. 3,832,585, upon receiving computer commands from the Device Controllers, 1, data for application to the pins of a unit under test and associated control signals are developed within the Data And Control Logic Sections, 2, one of which is adapted for unique association with a pin of the unit under test (UUT). As in applicant's U.S. Pat. No. 3,832,585, also uniquely associated with each UUT pin are an Applied Data Shift Register, 3, a Logic Switch, 4, a Limiter Driver, 5, Relays, K1 and K2, an Attenuator Buffer, 6, a Voltage Comparator, 7, a Logic Comparator, 8, and an Error Register, 9. As already explained, these components function in applicant's new invention substantially as described in U.S. Pat. No. 3,832,585. However, unlike applicant's previous invention, the present invention comprises new components and features associated with monitoring and clock functions, and which allow for the simultaneous application of digital signals to the UUT pins which differ in voltage level.

MONITORING

Referring again to FIG. 1, a 4 megacycle Field Effect Transistor (FET) switch, 10, is associated with each pin of the UUT and is located to the UUT pin side of relays K1 and K2 so that when both relays are closed it may operate to effect the alternate connecting of the UUT pin with the Applied Data Shift Register, 3, and the receive registers — the Voltage Comparator, 7, Logic Comparator, 8, and Error Register, 9. As those skilled in the art are aware, such a FET switch is able to effect switching at approximately 1000 times the speed of a conventional relay.

When the monitoring of the pins of a UUT is necessary, e.g., when the UUT may generate response signals in extremely short time periods (e.g., 250 nanoseconds)

after receiving a stimulus test signal, the FET switch is used as follows.

Both relays K1 and K2 are closed so that the driver component, Applied Data Shift Register, 3, and the receiver components, e.g., the Voltage Comparator, 7, would, but for the FET switch, both be electrically connected to the same pin of the UUT. However, the FET switch may be initially set so as to connect only the receiver components to the UUT pin. The switching of the FET switch so as to alternately connect the driver and receiver registers and then just the receiver registers to the UUT pin is controlled by FET Control Register, 11. As is known by those skilled in the art, the FET switch may be set so that it "switches" upon the reception of a binary electrical pulse. For instance, a binary "1" pulse may indicate that both the driver and receiver components are to remain connected to the UUT pin and a "0" pulse may indicate that the driver is to be disconnected and that the receiver components are to be connected to the UUT pin. Accordingly, the FET Switch Control Register, 11, may be loaded with the binary bits, "1's" and "0's", which indicate the status of the associated FET switch. In response to computer command, or clock signals, the bits of the Control Register, 11, will be transmitted to the FET switch, 10, causing the FET switch to connect alternately, in accordance with the bit signals so transmitted, the driver and receiver components or just the receiver components to the UUT pin. Because of the speed of the FET switching and the described manner in which its switching is controlled, real time, programmed switching between drive and receive mode can be accomplished. This assures that no significant UUT response signals will be lost as often occurrs in the case of drive-receive mode switching carried out by conventional relays. Also, because of this real time switching ability of the present invention, the Applied Data Shift Register, 3, may if desired be connected to the Logic Comparator, 8, as shown in FIG. 1, so as to be able to act in a receive mode to receive UUT generated response signals, once it has finished applying signals to the UUT and the FET switch has switched out of the drive mode. This would not be sensible with conventional speed drive-receive mode switching.

In one preferred embodiment the above described FET switching may be effected by simply loading the Control Register, 11, with a number of binary "1" bits which correspond to the number of bits to be applied to the UUT pins by Applied Data Shift Register, 10, followed by a "0" bit. The Control Register may then act as a counter of the bits applied by the driver, transmitting one of the bits it holds to the FET switch every time a bit is applied to the UUT pin by the Shift Register, and therefore upon the completion of the driving operation, transmitting an "0" bit to the FET switch, causing a switch to the receive to the receive mode to occur if the FET switch has been appropriately set. The counting off of control bits in the FET Switch Control Register may be regulated by direct computer control, or by clock pulses from one of the system's programmable clocks, 17–24.

Thus, one of the advantages of the present invention is already clear. A real time change from drive mode to receive mode may be made during a test. As previously discussed, this allows realistic testing of fast response electrical units, e.g., a bidirectional microprocessor bus, without the possibility of losing or failing to detect a response signal from the unit being tested.

MULTI-VOLTAGE LEVEL OPERATION

Also associated with the receiver and driver components for each UUT pin are digital to analog signal level conversion equipment, 13 and 14 respectively. This apparatus for each UUT pin is controlled by signals generated from the Data and Control Logic Section, 2. This is a radical departure from applicant's previous invention described in U.S. Pat. No. 3,832,535. In the device shown in that patent a single programmable power supply was used for selecting the amplitude levels for all the signals to be applied to all the pins of the UUT and for predesignating those signal levels which are deemed acceptable in a received signal. The present invention unlike that taught in the 3,832,535 patent provides for the application of signals to UUT pins, each of which may differ from the other in voltage level. The digital/analog signal level equipment for each UUT pin, 13 and 14, are substantially identical to the programmable power supply and level switching equipment described in U.S. Pat. No. 3,832,535.

Thus, a second advantage of the present invention is now clear: the ability to apply simultaneously test signals to the pins of the UUT which differ in voltage level; the signals applied to each pin may have a unique programmed voltage level. As already mentioned this allows for the realistic testing of circuit boards comprising components of various voltage response and power requirements.

CLOCK SYSTEM

In the invention disclosed and claimed in U.S. Pat. No. 3,832,535, a programmable clock signal generator generates and applies electrical pulse signals for regulating the application of multi-bit digital words to the pins of a UUT. Since in the devices described in that patent all drivers are essentially regulated by one clock source, the bits applied simultaneously to various pins must be applied at the same rates. The present invention provides multiple independent clocks and is thus able to provide for the simultaneous application of bits to the various pins of a UUT at differing programmable rates.

Referring again to FIG. 1, the independent programmable clocks or clock channels, 17–24, are contained within the programmable clock system, 25. Each clock may act under computer control through an associated device controller (not shown) or in response to pulses from the other clocks or if desired, UUT pin generated or other external stimuli. In response to computer commands, each clock may be assigned to one or more UUT pin driver/receiver circuits. This occurs in the Clock Allocator 25A, or multiplexer, which switches clocks into connection with assigned driver/receiving circuits under program control through its device controller 25B. There is virtually no limit to the number of driver/receiver circuits one clock may control — may be as many as that are in the system, as few as one, or any number in between. Not more than one clock, however, should be connected to one driver/receiver circuit at one time.

Associated with each driver/receiver circuit is an 8 × 1 multiplexer, 16, through which the driver, error and FET switch control regulators of the driver/receiver circuit are connectable to each of the eight programmable clock channels.

Each clock may apply timing and control pulses to the drivers to which it is connected which regulate the shifting of data through the Applied Data Shift Register, 3, for registering data in Error Register, 9, and for shifting data from FET Switch Control Register, 11. Thus, multi-bit digital signals can be applied to the pins of a UUT at as many as eight separate programmable rates (or in the case of additional clocks, at as many different rates as there are clocks).

GENERAL CLOCK STRUCTURE

Figure 2:
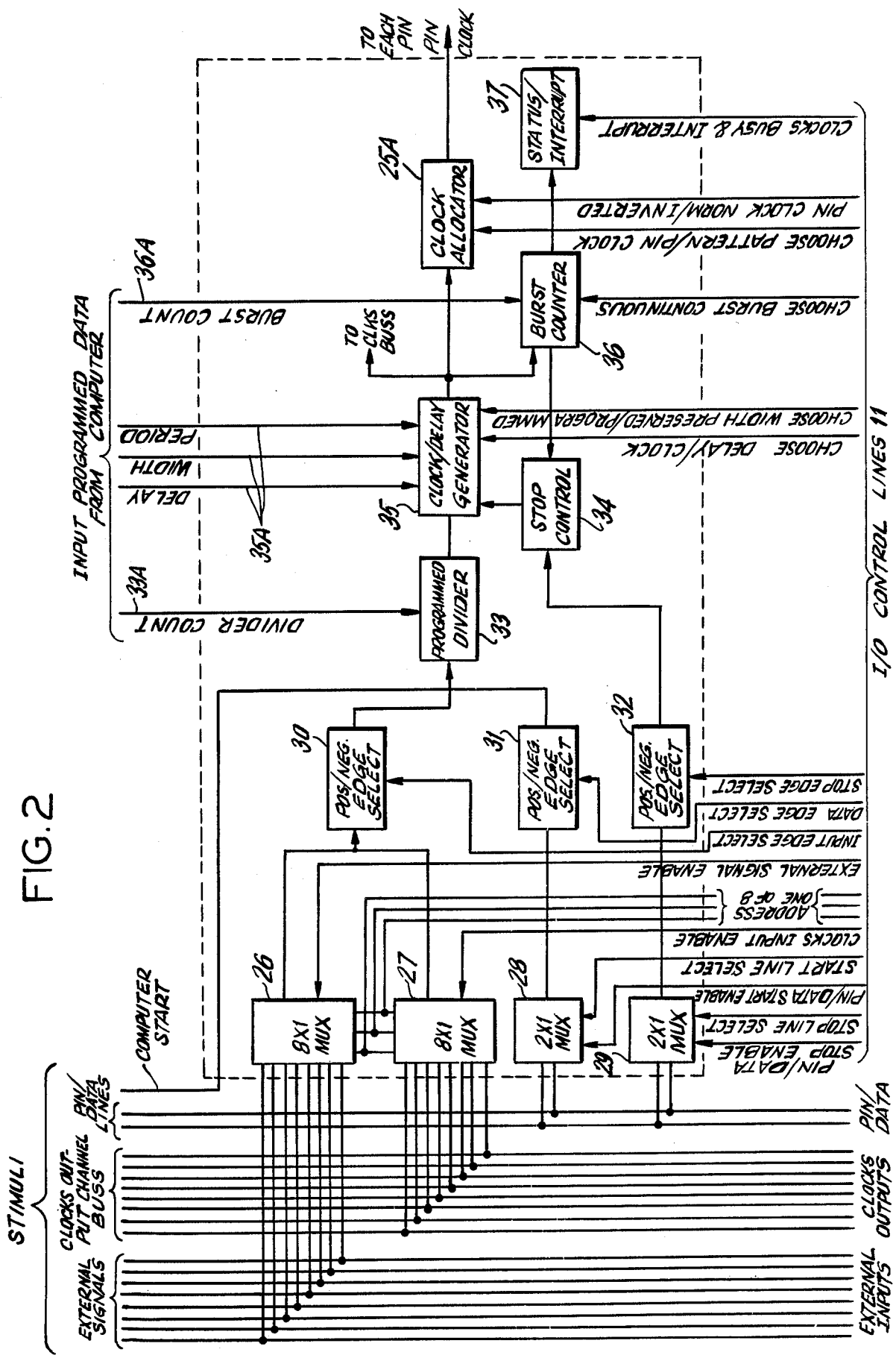
FIG. 2 is a block diagram detailing one of the programmable clocks of the device shown in FIG. 1.

FIG. 2 is a block diagram of one of the clocks or clock channels, 14–24, of FIG. 1. Referring now to FIG. 2, computer commands to the clocks are carried over Input/Output (I/O) control lines, 11. These commands designate control data for clock components 26–39.

Components 26 and 27 are 8 × 1 multiplexers which select the stimuli to start the clock/delay generator, 35, from either an external input or another clock channel. Component 28 is a 2 × 1 multiplexer which selects which (if any) pin data line is chosen for input to the clock. Address and enable lines are provided (as I/O control lines, 11) to control these functions. Components 30 and 31 determine in conventional manner known to those skilled in the art whether the clock is started on the positive or negative input edge of the stimulus input signal.

The pin data lines, 29A, represented as I/O control lines 11, can also be used to stop the clock from UUT generated signals. The positive or negative edge of an external stimulus signal can be used to stop the clock. This is accomplished by components 29, 32 and 35, which are respectively a 2 × 1 multiplexer, a positive/negative edge selection device and a stop control, in a conventional manner known to persons skilled in the art.

The selected external stimuli are channelled through a divider section, 33, before they are fed to the clock delay generator, 35. The divider accomplishes the skipping of a programmed designated number of wave pulse events, or the integral division of a number of input wave pulse events in accordance with divider count computer generated input data, 33A.

The Clock/Delay generator, 35, generates from the input signal coming from the divider, 33, derivative pulse signals having periods, widths and delays in accordance with computer generated data, 35A.

The output of the clock/delay generator is fed to the Clock Allocator, 25A (also depicted in FIG. 1) which directs the clock output to designated driver/receiver circuits in accordance with computer command.

If it is desired, the generated clock signals can be fed directly to a UUT pin in either a normal or inverted form.

A clock can be provided in the above discussed manner or, alternatively, it may be controlled to provide a specific number of burst counts. The burst counter, component 36, can be programmed with burst data up to a count of 4,096 bits. This corresponds with the bit size of the Applied Data Shift Register of the preferred embodiment.

Finally, clock component 37 is a status interrupt which generates its clock's busy signal to computer queries or interrupts the computer in accordance with previous computer commands and external stimuli.

As can be seen from the external input and clock output lines of FIG. 2, the clock input can come from any of the other seven clocks or itself, any of eight designated external stimulus sources, or from designated UUT pins.

CLOCK/DELAY GENERATOR STRUCTURE AND OPERATION

Figure 3:
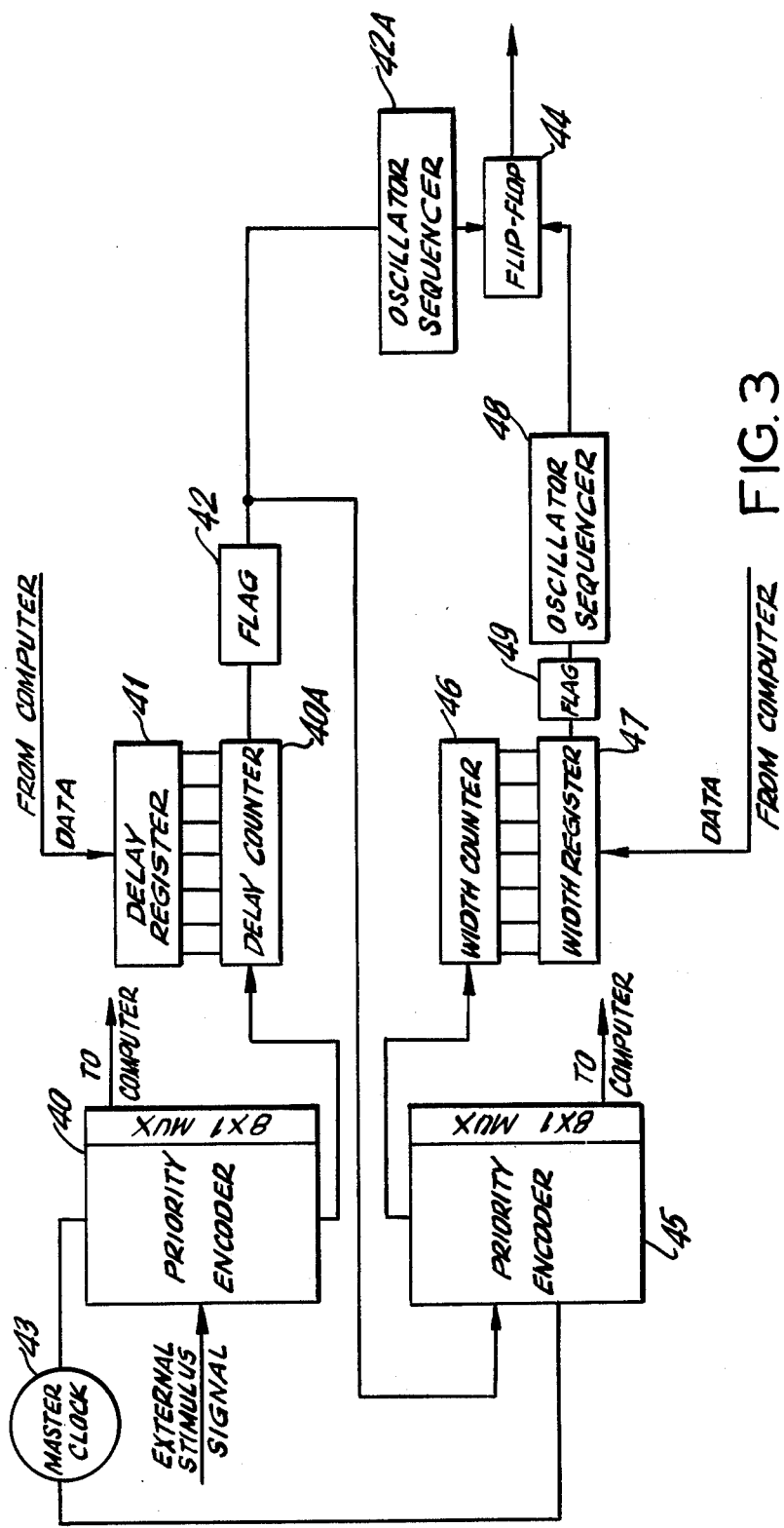
FIG. 3 is a block diagram of the clock delay/generator unit constituting an element of the clock depicted in FIG. 2.

FIG. 3 depicts in detail the Clock/Delay Generator, 35, of FIG. 2. Referring now to FIG. 3, the input signal to the Clock/Delay Generator first encounters Priority Encoder, 40. The Priority Encoder, 40, in response to pulses from a 25 MHZ Master Oscillator, 43, continuously generates potential output pulse signals in eight phases, each phased signal being 5 nanoseconds apart in starting edge from the starting edges of the immediately preceding and succeeding generated signals and each having a period of 40 nanoseconds and width of 20 nanoseconds. The starting edge of the eighth phased signal is 35 nanoseconds from the starting edge of the first phased signal. The input pulse signal is compared to the current potential output signals and the potential output signal closest in phase to the input signal is selected by an 8 × 1 multiplexer incorporated as a part of the Priority Encoder, for output.

Figure 4:
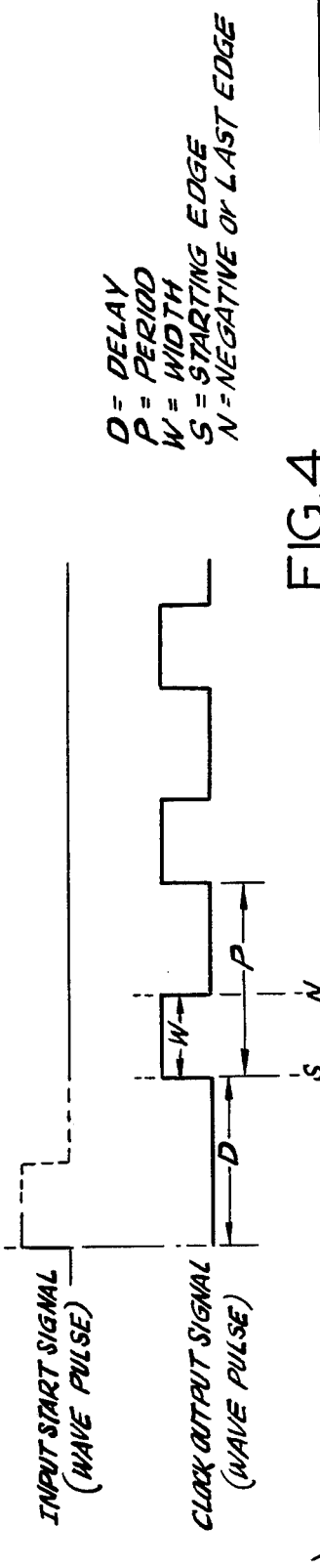
FIG. 4 is a schematic diagram showing the relationships of clock signal delay, period, width, starting edge and negative edge.

FIG. 4 is a schematic diagram illustrating clock output signal delay, period, width, starting edge and negative edge.

Referrring again to FIG. 3, the output signal of Priority Encoder, 40, proceeds to the Clock Delay Counter, 40A, where it is given a programmed clock delay. The programmed period/delay information is transmitted in digital form from the computer (not shown) to Delay Register 41. This period/delay information defines the starting wave pulse edge and the period of the Clock-/Delay Generator output wave pulse signal as depicted in FIG. 4. Again considering FIG. 3, the Clock Delay Counter is loaded from the Delay Register to reflect the programmed signal delay. The Clock Delay Counter, being a programmable 40 nanosecond clock, the programmable delay is in integral multiples of 40 nanoseconds. Thus, a delay of 1 count is a delay of 40 nanoseconds. When the count in Clock Delay Counter, 40A, goes to 0, Flag 42 is set, thereby causing Oscillator Sequencer, 42A, to further delay the signal by one of several fixed increments (0, 10, 20 or 30 nanoseconds) in accordance with computer command and to activate Flip-Flop 44, so as to generate a Clock Delay/Generator output signal having delayed starting edges from 0 nanoseconds to 100 milliseconds from those of the input external stimulus signal (with a minimum resolution of 10 nanoseconds). The output signal of Priority Encoder, 40, after leaving Clock-Delay Counter, 40A, proceeds as an input signal to Priority Encoder, 45, which outputs a signal locked on to its input signal within 5 nanoseconds in a manner similar to that of Priority Encoder 40. The output signal from Priority Encoder 45 then proceeds to Clock Width Counter 46. Signal width information is transmitted in digital form to the Width Register, 47. This width information defines the negative edge of the Clock/Delay Generator output signal. The Clock Width Counter being a 40 nanosecond clock, like the Delay Counter, each count in the clock width counter delays the negative edge of the Clock Delay Generator output signal by 40 nanoseconds. The Clock Width Counter is loaded from the width register to reflect the programmed signal width. The minimum programmable width is 40 nanoseconds. The programmable width is some integral multiple of 40 nanoseconds. When the count in the Clock Width Counter goes to 0, Flag 49 is set, thereby causing Oscillator Sequencer, 48, to further delay the negative edge of the signal by a fixed increment of 0, 10, 20 or 30 nanoseconds in accordance with computer command, and to activate again Flip-Flop 44, so as to delay the negative edges of the Clock Generator output wave pulse signal, from the starting edges of the Clock Generator output wave pulse signal by 40 nanoseconds to 100 milliseconds with a minimum resolution of 10 nanoseconds.

It should be understood that all devices described above as receiving data or instructions from the computer or transmitting data to the computer are electrically connected to the computer through a device controller in the manner described in U.S. Pat. No. 3,854,125 entitled Computerized Diagnostic Test System, assigned to the assignee of the present invention.

The signals generated and synchronized by the clock system in the above described manner may be applied to the pins of the UUT or may be used in analyzing (comparing) received UUT responses. It can be seen that the clock system of the present invention provides a broad range of signals which may be used in the testing of UUT's.

The clock system of the present invention wherein the programmable clocks reside in the clock/delay generator is a significant advance from the prior art which in general attempted to accomplish the described functions by having a startable clock (external to the delay generator) feed a number of divider/delay channels. The novel arrangement presently claimed is considerably less cumbersome and less expensive than such equipment.

According to the present invention it is possible to: produce a clock signal with a period as low as 100 nonoseconds; generate signals synchronized with external stimulus signals within 5 nanoseconds; and maintain signals in synchronization with a 10 nanosecond resolution — all using conventional synchronous 40 nanosecond clocks. The signals generated may then be used to regulate the application of selected digital words to the terminals of the unit under test.

What is claimed is:

1. Improved digital word generating and receiving apparatus for generating and applying serially to plural terminals of a unit under test plural stimulus multibit digital words and for receiving for analysis from the terminals of the unit under test plural response signals, having a unique applied data shift register for applying said multibit digital words to each of said terminals and a unique means for receiving said response signals therefrom, wherein the improvement comprises means for controlling the application from said plural applied data shift registers of said plural multibit digital words to said plural unit under test terminals so that each of said plural applied data shift registers is able to apply multibit digital words to its associated unit under test terminal at a rate independent from that of other applied data shift registers.

2. Improved digital word generating and receiving apparatus as claimed in claim 1, wherein the improvement further comprises:
   a. unique independently controllable means associated with each applied data shift register for varying the voltage level of the multibit digital words applied thereby; and
   b. means for real time switchng in accordance with designated program control between a first mode in which a specified applied data shift register is able to apply multibit digital words to the associated unit under test terminal and a second mode in which any specified receiving means associated with any of said terminals is able to receive response signals therefrom.

3. Improved digital word generating and receiving apparatus as claimed in claim 2 wherein said means for real time switching between said first and second modes comprise a unique field effect transistor switch for connecting each unit under test terminal alternately to its associated applied data shift register and its receiving means, and a digital electrical signal register connected to each field effect transistor switch for regulating the opening and closing of said switch by the application thereto of digital bits in accordance with designated program control.

4. Improved digital word generating and receiving apparatus as claimed in claim 2 wherein said unique independently controllable means associated with each applied data shift register for varying the voltage level of the multibit digital words applied thereby comprises:
   separately controllable digital to analog and analog to digital electrical signal converter means for each terminal of the unit under test, connected respectively to the applied data shift register and receiving means associated with each said terminal, for regulating the voltage level of multibit digital words applied to and received from the unit under test terminal in accordance with designated program control.

5. Improved digital word generating and receiving apparatus as claimed in claim 4 wherein said means for controlling the application from said plural applied data shift registers of said plural multibit digital words to the said plural unit under test terminals so that each of said plural applied data shift registers is able to apply multibit digital words to its associated unit under test terminal at a rate independent from that of other applied data shift registers comprises:
   a. plural clocks for generating electrical pulses of varying frequency and for applying said pulses to selected applied data shift registers so as to regulate the serial application of multibit digital words by said selected applied data shift registers to the associated unit under test terminals; and
   b. a clock allocator for electrically connecting each of said plural clocks to selected applied data shift registers in accordance with designated program control.

6. Improved digital word generating and receiving apparatus as claimed in claim 5 wherein each of said plural clocks comprises:
   synchronous signal generation means for generating output electrical pulse signals locked on to received input signals; means for delaying said output electrical pulse signals in accordance with designated program control; means for fixing the width of said output electrical pulse signals in accordance with designated programmed control; means for fixing the period of said output electrical pulse signals in accordance with designated program control,
so that each of said plural clocks can in response to any input electrical signal, generate an output electrical signal synchronized to said input signal by a designated degree with a resolution of at least five nanoseconds.

* * * * *